(12) United States Patent
Shioga et al.

(10) Patent No.: US 6,894,396 B2
(45) Date of Patent: May 17, 2005

(54) SEMICONDUCTOR DEVICE WITH CAPACITOR

(75) Inventors: Takeshi Shioga, Kawasaki (JP); John David Baniecki, Kawasaki (JP); Kazuaki Kurihara, Kawasaki (JP); Yasuo Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/619,483

(22) Filed: Jul. 16, 2003

(65) Prior Publication Data
US 2004/0012085 A1 Jan. 22, 2004

(30) Foreign Application Priority Data
Jul. 18, 2002 (JP) ........................................ 2002-210176

(51) Int. Cl.⁷ .............................................. H01L 23/48
(52) U.S. Cl. ...................... 257/777; 257/499; 257/723; 257/724; 257/726; 257/737
(58) Field of Search ................................ 257/777, 499, 257/723, 724, 726, 737

(56) References Cited

U.S. PATENT DOCUMENTS 5,404,265 A    4/1995  Moresco et al.
5,548,474 A  * 8/1996  Chen et al. ................. 361/313
6,404,615 B1 * 6/2002  Wijeyesekera et al. .. 361/306.1

FOREIGN PATENT DOCUMENTS

| JP | 6-224257   |   | 8/1994 |             |
|----|------------|---|--------|-------------|
| JP | 7-111226   |   | 4/1995 |             |
| JP | 09199374 A | * | 7/1997 | ... H01G/4/33 |
| JP | 2001-102512|   | 4/2001 |             |

* cited by examiner

Primary Examiner—Nathan J. Flynn
Assistant Examiner—Remmon R. Fordé
(74) Attorney, Agent, or Firm—Westerman, Hattori, Daniels & Adrian, LLP

(57) ABSTRACT

A semiconductor device comprises a carrier substrate, an integrated circuit chip mounted on the carrier substrate via bumps, and a capacitor provided to stabilize operation of the integrated circuit chip at high frequencies. In the semiconductor device, the capacitor is electrically connected to pads on bottom of the integrated circuit chip, and the capacitor is provided to have a height on the carrier substrate that is smaller than or equal to a height of the bumps on the carrier substrate.

6 Claims, 6 Drawing Sheets

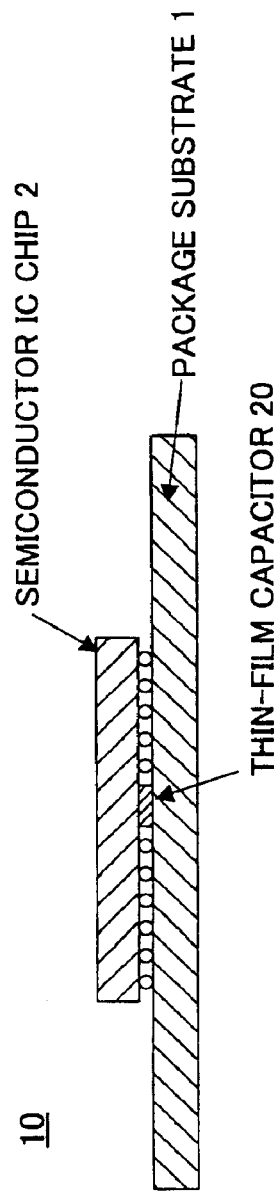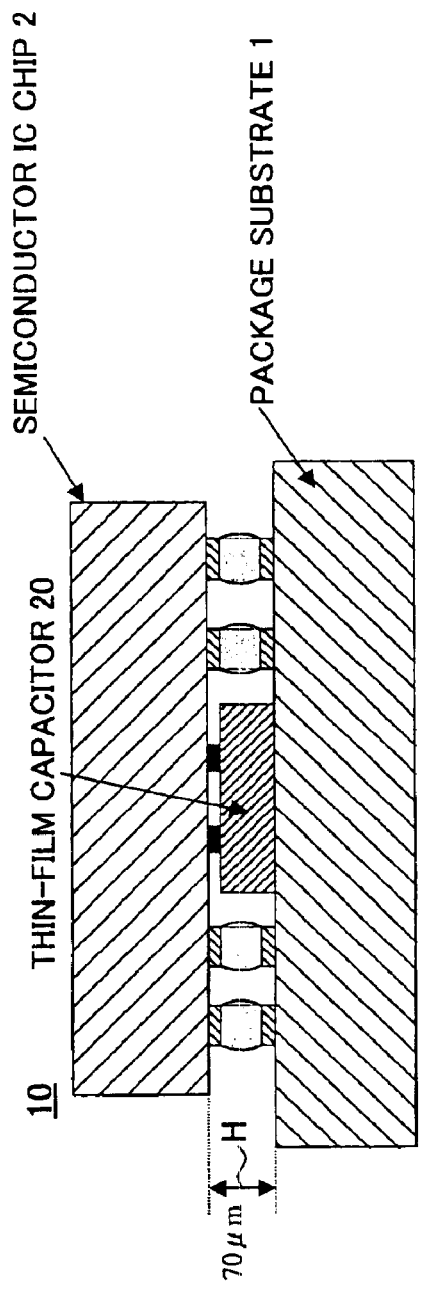
FIG.3A
FIG.3B

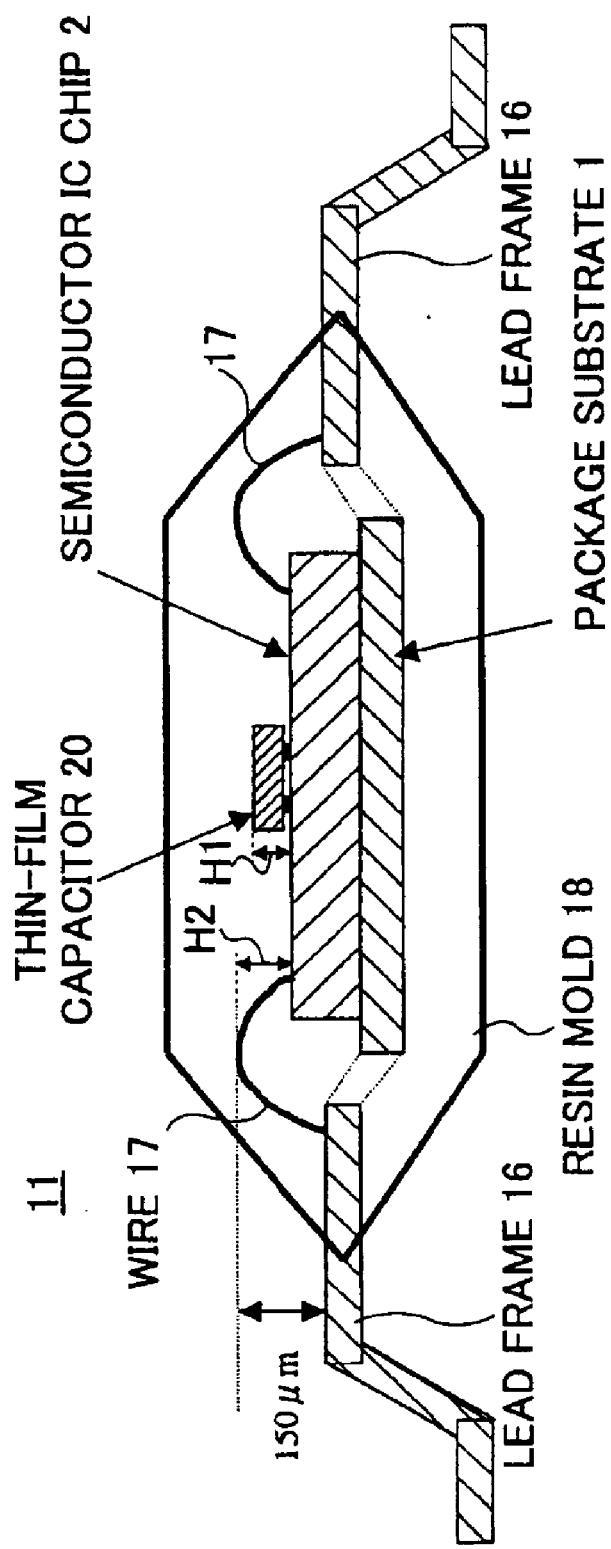

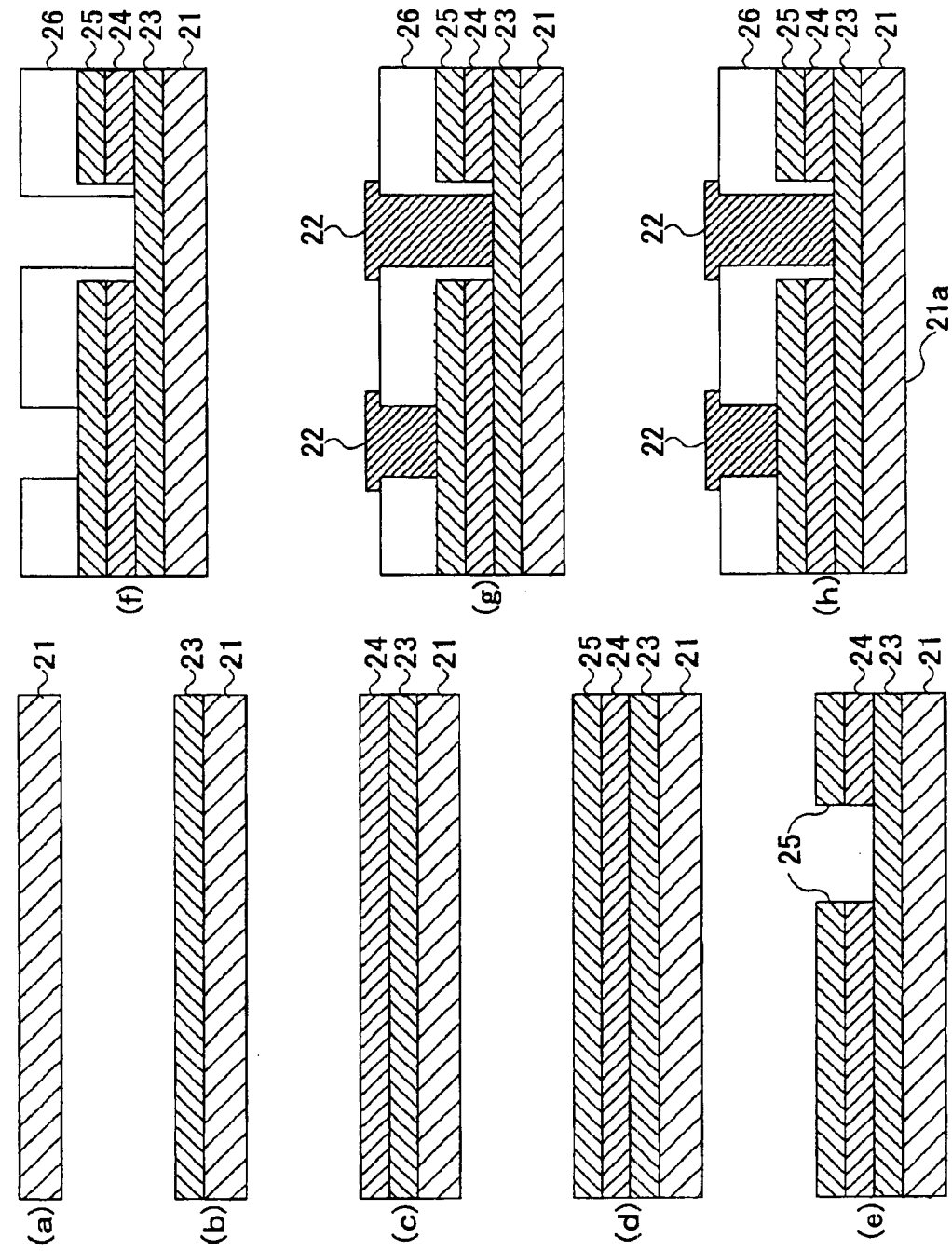

SEMICONDUCTOR DEVICE WITH CAPACITOR

CROSS-REFERENCE TO RELATED APPLICATIONS

This application is based upon and claims the benefit of priority from the prior Japanese Patent Application No. 2002-210176, filed on Jul. 18, 2002, the entire contents of which are incorporated herein by reference.

BACKGROUND OF THE INVENTION

1. Field of The Invention

The present invention relates to a semiconductor device which incorporates a semiconductor integrated circuit chip for use in electronic equipment, such as a computer. More specifically, the present invention relates to a semiconductor device in which a decoupling capacitor for power supply use is arranged in close proximity with a semiconductor integrated circuit chip in order to stabilize operation of the semiconductor integrated circuit chip at high frequencies.

2. Description of the Related Art

A decoupling capacitor (or bypass capacitor) is commonly used with the semiconductor integrated circuit (IC) chip to reduce the noise in the power supplied to the IC chip. Advances in IC technology have increased the switching speeds employed by the recent IC devices, so that many IC chips are capable of operation at high frequencies, or microwave frequencies. High switching speeds increase the problem of power supply noise, a component of which is generated as the device is switched on and off. In order for the IC chip to function properly, the power supplied must be free from noise.

Use of the decoupling capacitor to alleviate the problem of power supply noise is well known. It is also well known that it is desirable to position the decoupling capacitor as close as possible to the IC chip for best effect. The leads connecting the capacitor to the IC chip have an inherent inductance which becomes significant at high speed operation, to the point that if the capacitor is positioned too far from the IC chip, the lead inductance can cancel the usefulness of the capacitor for eliminating power supply noise.

In a semiconductor device in which decoupling capacitors are arranged near a semiconductor integrated circuit (IC) chip as preventive measures against malfunctioning of the IC chip due to power supply noise at high frequencies, multi-layered chip capacitors have often been used as the decoupling capacitors.

FIG. 1 shows the structure of a semiconductor device in which multi-layered chip capacitors are mounted.

In the semiconductor device of FIG. 1, the semiconductor IC chip 2 is connected to the top of the package substrate 1 using BGA (ball grid array) connection, and the multi-layered chip capacitors 4 are connected to the bottom surface of the package substrate 1 via solder bumps. The package substrate 1 is also connected to the top of the circuit wiring board (mother board) 3 via solder bumps. The package substrate 1 is, for example, a multi-chip module (MCM) substrate.

As for the semiconductor device of FIG. 1, in order to avoid the interference of the height of the multi-layered chip capacitors 4 with the circuit wiring board 3, the portion of the circuit wiring substrate 3 where the capacitors 4 are mounted in opposing relationship to the substrate 3 must be cut through.

In this case, the inductance between the semiconductor IC chip 2 and the capacitors 4 poses the problem of power supply noise at high frequencies.

The semiconductor device, such as shown in FIG. 1, requires the wiring leads within the package substrate 1 to connect the multi-layered chip capacitors 4 and the semiconductor IC chip 2, and the wiring leads within the package substrate 1 have a significant inductance when the IC chip 2 operates at high frequencies. Even if the decoupling capacitors 4 are arranged therein, the effect of suppressing the fluctuation of the power-supply voltage to the IC chip 2 during high-speed operation and the effect of absorbing the high frequency ripple are fading.

What is needed for suppressing the variation of the power-supply voltage to the IC chip 2 is to reduce the equivalent in-series resistance (ESR) and the equivalent in-series inductance (ESL) of the capacitors 4. Especially there is a problem in that the increase in the inductance due to the wiring leads within the package substrate 1 deteriorates the high frequency characteristics of the decoupling capacitors 4.

In order to overcome the problem, reduction of the inductance is attained by positioning the capacitors as close as possible to the IC chip such that the length of the wiring leads from the power supply and the ground of the IC chip to the capacitors is made shortest.

Japanese Laid-Open Patent Application No. 4-211191 discloses a substrate with a built-in capacitor which is formed with a thin-film dielectric layer and conductive layers on a ceramic wiring substrate. The capacitor is devised to reduce the inductance, thereby realizing reduction of the power supply noise.

Moreover, Japanese Laid-Open Patent Applications No. 7-176453, No. 2001-68583 and No. 2001-35990 disclose some thin-film decoupling capacitors. In such capacitor configurations, the upper surface pads of the capacitor formed on the carrier substrate having the via holes are connected to the semiconductor IC chip, and the lower surface pads are connected to the circuit wiring substrate. The capacitor configurations are provided to reduce the inductance.

FIG. 2A and FIG. 2B show the structure of each of conventional semiconductor devices in which the interposer with a built-in capacitor is mounted.

In the configuration of FIG. 2A, the semiconductor IC chip 2 is connected to the top of the package substrate 1 using BGA connection, and the interposer 5 with the built-in capacitor is connected to the bottom of the IC chip 2 using BGA connection. In the configuration, to avoid the interference between the interposer 5 and the package substrate 1, the surface portion of the package substrate 1 where the interposer 5 is mounted is cut partially.

In the configuration of FIG. 2B, the semiconductor IC chip 2 is connected to the top of the interpose 5 with the built-in capacitor using BGA connection, and the interposer 5 is connected to the top of the package substrate 3 using BGA connection.

When compared with the semiconductor device of FIG. 1, the semiconductor devices of FIG. 2A and FIG. 2B have a shorter connection distance of the IC chip and the capacitor. However, if the interposer configuration is used, the number of production processes needed to manufacture the semiconductor devices will increase, and also the technical difficulty of the production may arise. This makes the low-cost production of the semiconductor devices difficult. Moreover, the number of interconnections between the components of the semiconductor devices increases, and the problem of reliability may arise.

Furthermore, in the case of the configuration of FIG. 2A, because of the thickness of the capacitor itself, it is necessary to perform machining to cut partially the portion of the package substrate before the IC chip is mounted on the package substrate.

Conventionally, in order to position the capacitor in close proximity to the IC chip, it has been necessary to use the interposer-type chip capacitor mounted between the carrier substrate and the IC chip as shown in FIG. 2A or FIG. 2B.

However, to prepare the interposer-type chip capacitor, the through vias in the substrate must be formed. In order to form the through vias, it is necessary to carry out the simultaneous baking process for the conductive material and the ceramic material, or carry out the forming of through holes in the substrate such as a silicon substrate, and the filling of the conductive material into the through holes of the substrate. Therefore, the technical difficulty of the production will arise, and it is difficult to attain the low-cost production of the semiconductor devices.

SUMMARY OF THE INVENTION

An object of the present invention is to provide an improved semiconductor device in which the above-described problems are eliminated.

Another object of the present invention is to provide a semiconductor device which is configured to position the decoupling capacitor as close as possible to the semiconductor IC chip for best effect of the decoupling capacitor, without using the interposer type configuration and the multi-layered chip capacitor configuration as in the conventional semiconductor devices.

The above-mentioned objects of the present invention is achieved by a semiconductor device comprising: a carrier substrate; an integrated circuit chip mounted on the carrier substrate through bumps; and a capacitor provided to stabilize operation of the integrated circuit chip at high frequencies, wherein the capacitor is electrically connected to pads on bottom of the integrated circuit chip, and the capacitor is provided to have a height on the carrier substrate that is smaller than or equal to a height of the bumps on the carrier substrate.

In the semiconductor device of the present invention, the capacitor is formed on a substrate made of silicon or glass and having a flat and smooth surface, and the entire thickness of the capacitor is reduced by machining the back surface of the capacitor substrate. The thin film capacitor is provided to have a height on the carrier substrate that is smaller than or equal to a height of the bumps on the carrier substrate, and it is possible that the capacitor be mounted in the shortest distance near the IC chip.

The above-mentioned objects of the present invention is also achieved by a semiconductor device comprising: a carrier substrate; an integrated circuit chip mounted on the carrier substrate; a capacitor provided to stabilize operation of the integrated circuit chip at high frequencies; and a lead frame provided on the carrier substrate and electrically connected to the integrated circuit chip through a wire, wherein the capacitor is electrically connected to pads on the integrated circuit chip, and the capacitor is provided to have a height on the integrated circuit chip that is smaller than a height of the wire on the integrated circuit chip.

In the semiconductor device of the present invention, the capacitor is formed on a substrate made of silicon or glass and having a flat and smooth surface, and the entire thickness of the capacitor is reduced by machining the back surface of the capacitor substrate. The thin film capacitor is electrically connected to pads on the integrated circuit chip, and the capacitor is provided to have a height on the integrated circuit chip that is smaller than a height of the wire on the integrated circuit chip. It is possible that the capacitor be mounted in the shortest distance near the IC chip.

According to the semiconductor device of the present invention, the decoupling capacitor can be mounted directly on the IC chip bottom in the shortest distance near the IC chip. The resistance and the inductance of the decoupling capacitor in the semiconductor device can be lowered by such configuration. Therefore, it is possible for the semiconductor device of the present invention to stabilize high-frequency operation of the IC chip.

BRIEF DESCRIPTION OF THE DRAWINGS

Other objects, features and advantages of the present invention will become apparent from the following detailed description when read in conjunction with the accompanying drawings.

FIG. 3A and FIG. 3B are diagrams showing the structure of a semiconductor device of the first preferred embodiment of the present invention.

FIG. 4 is a diagram showing the structure of a semiconductor device of the second preferred embodiment of the present invention.

FIG. 5 is a diagram for explaining a method of production of a thin film capacitor for use in the semiconductor device of the present invention.

DETAILED DESCRIPTION OF PREFERRED EMBODIMENTS

Figure 1:
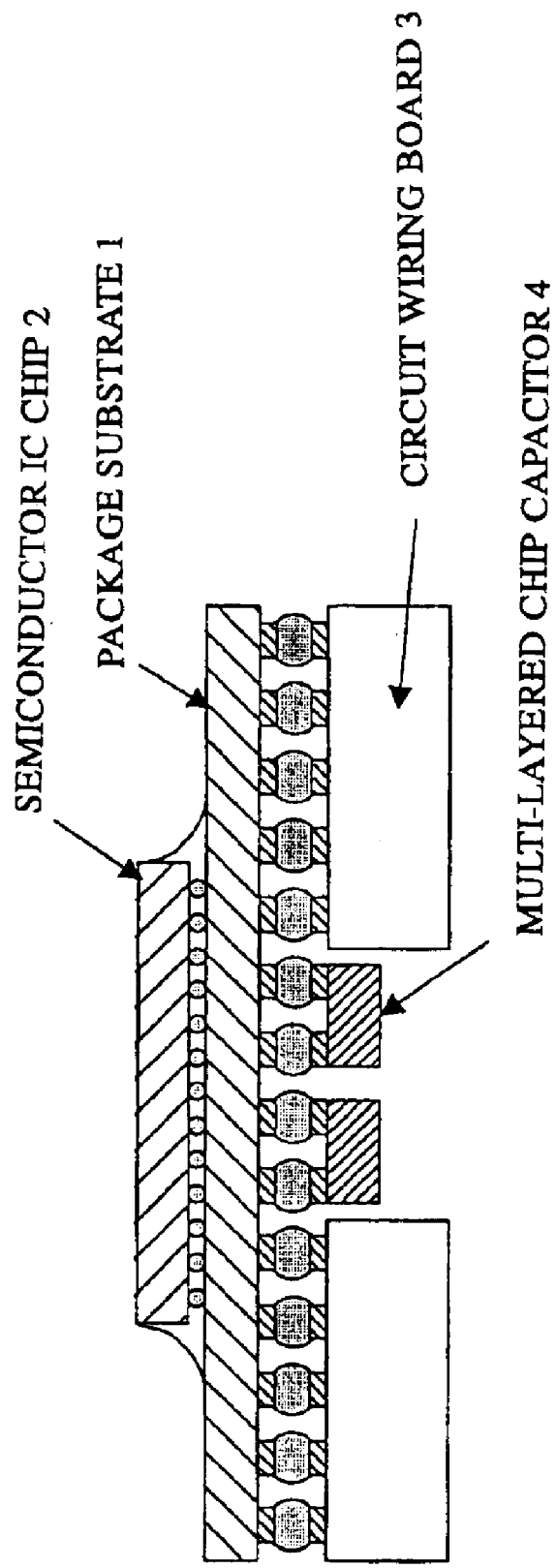
FIG. 1 is a diagram showing the structure of a semiconductor device in which multi-layered chip capacitors are mounted.
Figures 2A, 2B:
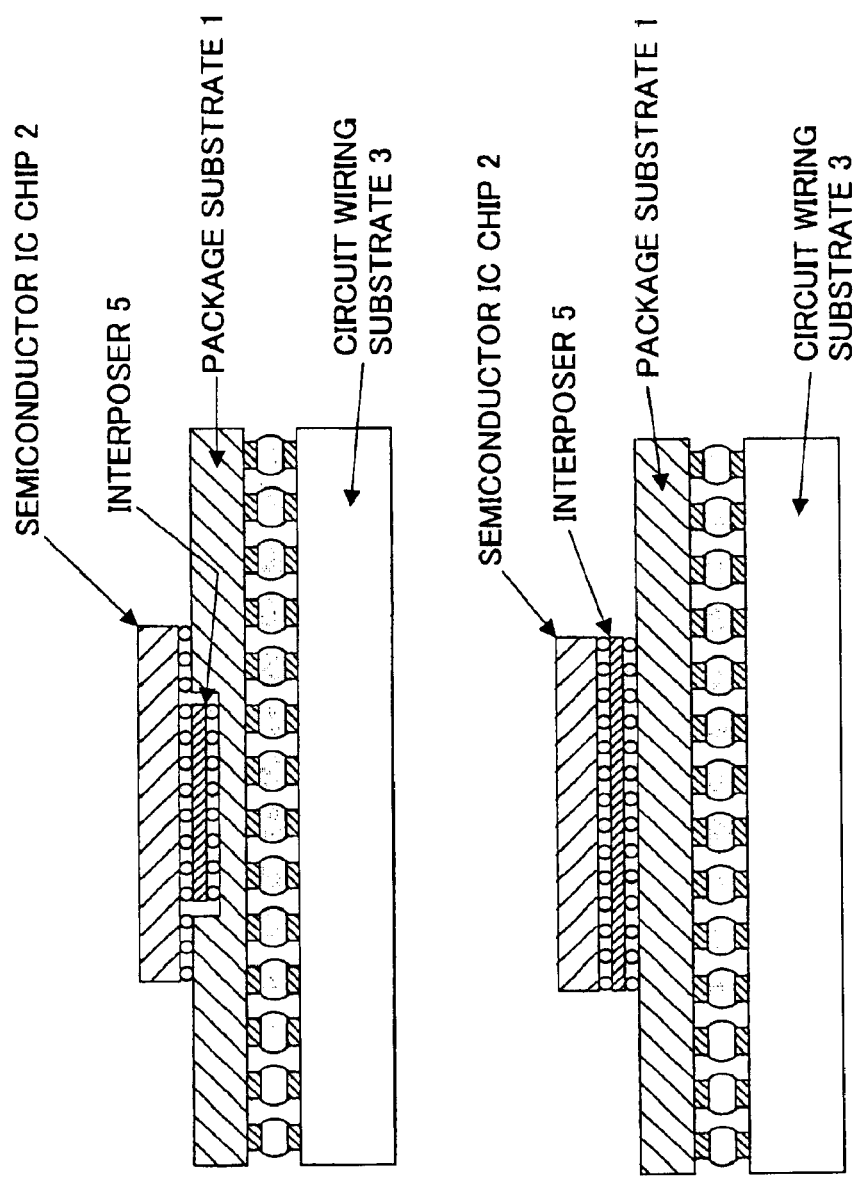
FIG. 2A and FIG. 2B are diagrams showing the structure of each of conventional semiconductor devices in which an interposer with a built-in capacitor is mounted.

A description will now be given of preferred embodiments of the present invention with reference to the accompanying drawings.

FIG. 3A and FIG. 3B show the structure of a semiconductor device of the first preferred embodiment of the present invention. FIG. 3A is a cross-sectional view of the semiconductor device of the present embodiment, and FIG. 3B is an enlarged view of the semiconductor device of FIG. 3A.

As shown in FIG. 3A and FIG. 3B, the semiconductor device 10 includes a package substrate 1 as a carrier substrate, a semiconductor integrated circuit (IC) chip 2 mounted on the package substrate 1, and a thin film capacitor 20 configured as a decoupling capacitor which stabilizes high-speed operation of the IC chip 2.

The thin film capacitor 20 is electrically connected to the electrode pads on the bottom of the IC chip 2. The thin film capacitor 20, including the capacitor substrate, is provided to have a height on the package substrate 1 that is smaller than or equal to the height H of the solder bumps of the IC chip 2 on the package substrate 1.

The thin film capacitor 20 in the present embodiment is provided on a substrate made of silicon or glass and having a flat and smooth surface, and an upper electrode layer and a lower electrode layer, which interpose a dielectric layer therebetween, are formed on the substrate. The entire thickness of the capacitor 20, including the pads and the substrate, is reduced to 50 micrometers or less by machining the back surface of the capacitor substrate. The capacitor 20 is electrically connected to the IC chip 2 by using the Au—Au ultrasonic joining of the pads of the capacitor 20 and the pads of the IC chip 2.

As shown in FIG. 3B, the solder bumps are used to mount the IC chip 2 on the package substrate 1, and the height H of the solder bumps of the IC chip 2 on the package substrate 1 is about 70 micrometers. The solder bump height H in this case is considered as containing the thickness of each electrode pad of the package substrate 1 and the IC chip 2.

Moreover, the thickness of each of the pads of the package substrate 1 and the pads of the IC chip 2 is about 10 micrometers. Therefore, it is possible to configure the semiconductor device 10 of the present embodiment so that the thin film capacitor 20, including the capacitor substrate, is provided to have a height on the package substrate 1 that is smaller than or equal to the height H of the solder bumps of the IC chip 2 on the package substrate 1.

In the present embodiment, the thin film capacitor 20 is provided with the substrate having the bottom surface that is in contact with the top surface of the package substrate 1, as shown in FIG. 3B. By this configuration, when connecting the semiconductor IC chip 2 to the package substrate 1 via the solder bumps, the solder bump height will be restricted to be in consistency with the height of the capacitor 20.

Since the distance between the semiconductor IC chip 2 and the package substrate 1 is specified in this manner, the spreading of the solder when the solder is melted or reflowed will be limited by the electrode pads of the IC chip 2 and the package substrate 1. By the surface tension of the solder, the solder bumps are formed into the cylindrical configuration rather than the spherical configuration.

For this reason, it is possible to prevent the stress concentration from arising at the solder connections between the pads of the semiconductor IC chip 2 and the pads of the package substrate 1.

In addition, Japanese Laid-Open Patent Application No. 57-118650 discloses that if the solder connections between the electrodes of the carrier substrate and the electrodes of the circuit component are formed into the cylindrical configuration instead of the spherical configuration when the solder is reflowed, the height of the soldered joints is increased in the same amount of the solder, and the stress by the temperature change will be distributed to the soldered joints uniformly. Therefore, according to the semiconductor device 10 of the present embodiment, the reliability of the solder connections of the circuit components can be improved.

FIG. 4 shows the structure of a semiconductor device of the second preferred embodiment of the present invention.

In the embodiment of FIG. 4, the semiconductor device 11 includes the package substrate 1 as a carrier substrate, the semiconductor IC chip 2 mounted on the package substrate 1, and the thin film capacitor 20 configured as a decoupling capacitor which stabilizes high-speed operation of the IC chip 2. The semiconductor device 11 of the present embodiment further includes a lead frame 16, wires 17, and a resin mold 18.

In the structure of the semiconductor device 11, the IC chip 2 and the lead frame 16 are electrically connected together by the wire bonding. After the wire bonding is performed, and the capacitor 20, the IC chip 2, the package substrate 1 and the wires 17 are enclosed in the resin mold 18.

In the present embodiment, the thin film capacitor 20 is electrically connected to the electrode pads on the top surface of the semiconductor IC chip 2, and the capacitor 20, including the substrate thereof, is provided to have a height H1 on the IC chip 2 that is smaller than a height H2 of the wires 17 on the IC chip 2, as shown in FIG. 4.

Similar to the previous embodiment of FIG. 3A and FIG. 3B, the capacitor 20 in the present embodiment is provided on a substrate made of silicon or glass and having a flat and smooth surface, and an upper electrode layer and a lower electrode layer, which interpose a dielectric layer therebetween, are formed on the substrate. The entire thickness of the capacitor 20, including the pads and the substrate, is reduced to 50 micrometers or less by machining the back surface of the capacitor substrate. The capacitor 20 is electrically connected to the IC chip 2 by using the Au—Au ultrasonic joining of the pads of the capacitor 20 and the pads of the IC chip 2.

As for the semiconductor device 11 of the present embodiment, it should be noted that the thin film capacitor 20 is provided to have the height H1 on the IC chip 2 that is smaller than the height H2 of the wires 17 on the IC chip 2. As shown in FIG. 4, the height of the wires 17 on the lead frame 16 is about 150 micrometers, and the semiconductor device 11 in which the capacitor 20 is mounted can be easily produced. Therefore, it is possible for the semiconductor device 11 of the present embodiment that the thin film capacitor 20 be mounted in the shortest distance near the IC chip 2.

Moreover, like the previous embodiment of FIG. 3A and FIG. 3B, in the semiconductor device 11 of FIG. 4, the thickness of the capacitor 20, including the substrate, is reduced to 50 micrometers or less by grinding or polishing the back surface of the silicon wafer as the capacitor substrate. In addition, the capacitor 20 is electrically connected to the IC chip 2 by using the Au—Au ultrasonic joining of the pads of the capacitor 20 and the pads of the IC chip 2. As mentioned above, the height of the wires 17 on the lead frame 17 is about 150 micrometers, and the interference of the thin film capacitor 20 when the capacitor 20 and the IC chip 2 are enclosed in the resin mold 18 can be easily avoided. Therefore, the semiconductor device 11 in which the thin film capacitor 20 is mounted can be easily produced.

Figures 6A, 6B:
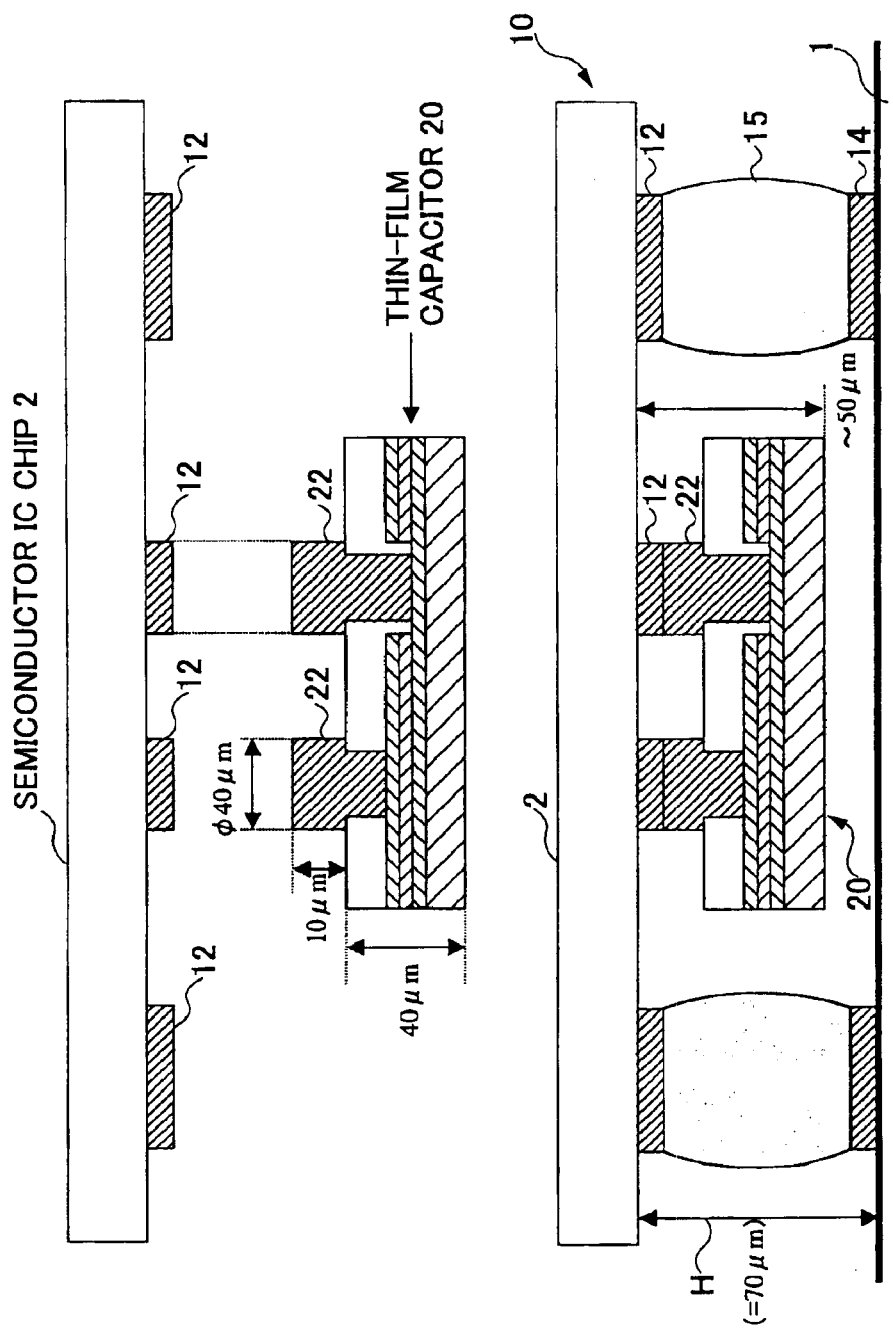
FIG. 6A and FIG. 6B are diagrams showing the structure of the semiconductor device of the present invention in which the thin film capacitor of FIG. 5 is mounted.

Next, FIG. 5 is a diagram for explaining a method of production of a thin film capacitor for use in the semiconductor device of the present invention. FIG. 6A and FIG. 6B show the detailed structure of the semiconductor device of the present invention in which the thin film capacitor of FIG. 5 is mounted.

A description will now be given of the method of production of the thin film capacitor.

As shown in (a) of FIG. 5, the silicon wafer 21 is used as a carrier substrate of the thin film capacitor. Use of the silicon wafer for the capacitor substrate facilitates formation of a thin film device since the back surface of the substrate (silicon) can be easily polished. The silicone substrate does not easily break even if it is polished to a thickness of about 30 micrometers. Hence, the silicon wafer 21 is appropriate for the carrier substrate of the thin film capacitor 20 according to the present invention.

Moreover, if the silicon wafer 21 is used as the capacitor substrate, the coefficient of thermal expansion of the semiconductor IC chip 2 and the coefficient of thermal expansion of the thin film capacitor 20 can be kept at the almost same level. It is possible to relieve the mounting stress during production of the semiconductor device.

As shown in (b), (c) and (d) of FIG. 5, the respective thin films of the lower electrode layer 23, the dielectric layer 24, and the upper electrode layer 25 are formed one by one on the silicon wafer 21.

In the present embodiment, the silicon wafer 21 on which a silicon dioxide ($SiO_2$) film with a thickness of 0.3 mm is formed is employed. First, the thin film of $TiO_2$ (0.05 micrometers)/Pt (0.1 micrometers), which is used as a lower electrode material, is formed on top of the silicon wafer 21 by the sputtering method. Second, the thin film of (Ba, Sr)$TiO_3$ (hereinafter, called BST), which is used as a highly dielectric material, is formed on top of the lower electrode layer 23 by the sputtering method within the same vacuum system. Third, the thin film of Pt (thickness: 0.1 micrometers), which is used as an upper electrode material, is formed on top of the dielectric layer 24 by the sputtering method.

A composite oxide containing at least one of the elements including strontium (Sr), barium (Ba), lead (Pb), tin (Zr), bismuth (Bi), tantalum (Ta), titanium (Ti), magnesium (Mg), niobium (Nb), etc. may be used as the source material suitable for the dielectric layer 24 of the thin film capacitor 20 according to the present invention. Besides (Ba, Sr)$TiO_3$ in the above-described embodiment, suitable dielectric oxide materials for the dielectric layer 24 of the thin film capacitor 20 may include Pb(Zr, Ti)$O_3$, Pb(Mg, Nb)$O_3$, $SrBi_2Ta_2O_9$, $Ta_2O_5$, etc.

Moreover, at least one of the metallic elements or the metallic oxides including platinum (Pt), gold (Au), copper (Cu), lead (Pb), ruthenium (Ru), ruthenium oxide, iridium (Ir), iridium oxide, chromium (Cr), etc. may be used as the source material suitable for the upper electrode layer 25 and the lower electrode layer 23, which interpose the dielectric layer 24 therebetween, in the thin film capacitor 20 according to the present invention.

Next, as indicated in (e) of FIG. 5, the patterning of the opening of the upper electrode layer 25 and the dielectric layer 24 is carried out by using the photolithographic method. Furthermore, the dry etching of both the Pt layer and the BST layer is performed by using the argon (Ar) ion milling.

As shown in (f) and (g) of FIG. 5, the polyimide insulating layer 26 is formed, and the 0.05 micrometer thick Cr film, the 1 micrometer thick Cu film and the 10 micrometer thick Au film are laminated one by one, so that the electrode pads 22 are formed in the polyimide insulating layer 26.

In order to perform the Au—Au ultrasonic joining of the electrode pads 12 of the semiconductor IC chip 2 and the electrode pads 22 as shown in FIG. 6B, the outermost surfaces (Au) of the pads 22 of the thin film capacitor 20 are formed with a diameter of about 40 micrometers and a thickness of about 10 micrometers, while the outermost surfaces (Au) of the pads 12 of the IC chip 2 are formed with a thickness of about 0.2 micrometers. The electrode pads 12 of the semiconductor IC chip 2 are formed similarly by laminating the 3 micrometer thick Cu film, the 2 micrometer thick Ni film and the 0.2 micrometer thick Au film one by one.

As shown in (h) of FIG. 5 and FIG. 6A, the back surface 21a of the silicon wafer 21 is ground or polished so that the thickness (except for the electrode pads 22) of the thin film capacitor 20 containing the substrate 21 is made to about 40 micrometers. This causes the height of the capacitor 20 on the package substrate 1 to be smaller than or equal to the mounting height (bump height) of the semiconductor IC chip 2 on the package substrate 1. In the present embodiment, as shown in FIG. 6A, the thickness of the capacitor 20, including the substrate 21 and the pads 22, is set to 50 micrometers or less.

By applying the thus formed capacitor 20, it is possible to obtain the semiconductor device of the present embodiment in which the thin-film decoupling capacitor is mounted.

As shown in FIG. 6B, the Au—Au ultrasonic joining of the electrode pads 22 of the thin film capacitor 20 and the electrode pads 12 of the semiconductor IC chip 2 attains electric connection between the electrodes of the thin film capacitor 20 and the electrodes of the semiconductor IC chip 2, and the semiconductor device 10 of the present invention is thus produced.

In the semiconductor device 10 of the present embodiment, the thickness of the thin film capacitor 20 is made to be slightly smaller than the solder bump height H of the semiconductor IC chip 2, and the back surface 21a of the substrate of the thin film capacitor 20 does not touch the top surface of the package substrate 1.

When the semiconductor device 10 is used as a finished product, it is desirable to configure the semiconductor device like the above-described embodiment such that the thin film capacitor 20 may not be affected directly by the stress fluctuation of the solder junctions (bumps) of the semiconductor IC chip 2 due to temperature change. According to the above-described embodiment, the solder fatigue life can be prolonged and the reliability of electrical connection of the solder junctions can be improved.

The production method of the thin film capacitor 20 for use in the semiconductor device 10 of the first preferred embodiment of FIG. 3A and FIG. 3B has been described in the foregoing. The thin film capacitor 20 for use in the semiconductor device 11 of the second preferred embodiment of FIG. 4 can be also produced in a similar manner.

Briefly, in a method of production of the thin film capacitor 20 for the second preferred embodiment of FIG. 4, the thin film capacitor 20 shown in FIG. 6A is placed upside down. In the inverted state of the thin film capacitor 20, the Au—Au ultrasonic joining of the electrode pads 22 of the thin film capacitor 20 and the electrode pads 12 of the semiconductor IC chip 2 is performed. The electrodes of the thin film capacitor 20 and the electrodes of the semiconductor IC chip 2 are joined together by the Au—Au ultrasonic joining. After the ultrasonic joining, the semiconductor device 11 of FIG. 4 is produced through the wire bonding and the resin molding.

As described in the foregoing, according to the semiconductor device of the present invention, the decoupling capacitor can be mounted directly on the IC chip bottom in the shortest distance near the IC chip. The resistance and the inductance of the capacitor in the semiconductor device can be lowered by such configuration. Therefore, it is possible for the semiconductor device of the present invention to stabilize high-speed operation of the IC chip in the high frequency range (GHz band).

Furthermore, the semiconductor device of the present invention serves as a semiconductor package in which the height of the capacitor components is adjusted suitably. Therefore, the solder fatigue life can be prolonged and the reliability of electrical connections of solder junctions can be improved according to the semiconductor device of the present invention.

The present invention is not limited to the above-described embodiments, and variations and modifications may be made without departing from the scope of the present invention.

What is claimed is:

1. A semiconductor device comprising:

a carrier substrate;

an integrated circuit chip mounted on the carrier substrate through bumps; and a capacitor provided to stabilize operation of the integrated circuit chip at high frequencies, wherein the capacitor is electrically connected to pads on bottom of the integrated circuit chip by bonding pads of the capacitor directly contacting the pads on the bottom of the integrated circuit chip, and the capacitor is provided to have a height on the carrier substrate that is smaller than or equal to a height of the bumps on the carrier substrate, and wherein the capacitor is provided with a substrate having a bottom surface in contact with a top surface of the carrier substrate on which the integrated circuit chip is mounted.

2. The semiconductor device of claim 1 wherein the carrier substrate is made of silicon.

3. The semiconductor device of claim 1 wherein the capacitor is provided with a dielectric layer containing a dielectric oxide, and the dielectric oxide of the dielectric layer is made of a composite oxide which contains at least one of elements including Sr, Ba, Pb, Zr, Bi, Ta, Ti, Mg, and Nb.

4. The semiconductor device of claim 1 wherein the capacitor is provided to have upper and lower electrodes which interpose a dielectric layer therebetween, and the upper and lower electrodes containing at least one of metallic elements or metallic oxides including Pt, Au, Cu, Pb, Ru, Ru oxide, Ir, Ir oxide, and Cr.

5. The semiconductor device of claim 1 wherein the capacitor is provided with a substrate and pads, and a thickness of the capacitor, including the substrate and the pads, is set to 50 micrometers or less.

6. The semiconductor device of claim 1 wherein the capacitor is a thin-film capacitor which includes a substrate, an upper electrode, a lower electrode and a dielectric layer, and the dielectric layer being interposed between the upper electrode and the lower electrode on the substrate of the capacitor.

* * * * *